US008918441B2

(12) United States Patent
Shimizu

(10) Patent No.: US 8,918,441 B2
(45) Date of Patent: Dec. 23, 2014

(54) NAF CONVERSION APPARATUS

(75) Inventor: Hideo Shimizu, Kawasaki (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 552 days.

(21) Appl. No.: 13/183,625

(22) Filed: Jul. 15, 2011

(65) Prior Publication Data

US 2011/0320511 A1 Dec. 29, 2011

Related U.S. Application Data

(63) Continuation of application No. PCT/JP2010/050420, filed on Jan. 15, 2010.

(30) Foreign Application Priority Data

Jan. 15, 2009 (JP) .................. 2009-006797

(51) Int. Cl.
*G06F 5/00* (2006.01)
(52) U.S. Cl.
USPC ......................................... 708/204
(58) Field of Classification Search
None
See application file for complete search history.

(56) References Cited

U.S. PATENT DOCUMENTS

| 7,433,905 | B2 * | 10/2008 | Joye | 708/204 |
| 7,602,907 | B2 * | 10/2009 | Zhu et al. | 380/30 |
| 2004/0119614 | A1 * | 6/2004 | Joye | 341/50 |
| 2006/0029222 | A1 * | 2/2006 | Lambert et al. | 380/28 |
| 2011/0320511 | A1 * | 12/2011 | Shimuzu | 708/204 |
| 2012/0131078 | A1 * | 5/2012 | Shimizu et al. | 708/204 |

FOREIGN PATENT DOCUMENTS

| JP | 63-311433 | 12/1988 |
| JP | 1-226221 | 9/1989 |
| JP | 10-307705 | 11/1998 |
| WO | WO 2006/054559 A1 | 5/2006 |

OTHER PUBLICATIONS

English Translation of IPRP dated Aug. 25, 2011 from corresponding PCT/JP2010/050420; 7 pages.
International Search Report and Written Opinion dated Mar. 23, 2010 from PCT/JP2010/050420.
Okeya, et al., "*The Width-w NAF Method Provides Small Memory and Fast Elliptic Scalar Multiplications Secure against Side Channel Attacks*", CTG-RSA, 2003, pp. 328-343.
Joye, et al., "*Optimal Left-to-Right Binary Signed-Digit Recoding*", IEEE Transactions on Computers, 2000, vol. 49, No. 7, pp. 740-748.

(Continued)

*Primary Examiner* — David H Malzahn
(74) *Attorney, Agent, or Firm* — Ohlandt, Greeley, Ruggiero & Perle, L.L.P.

(57) ABSTRACT

According to one embodiment, a NAF conversion apparatus which converts a binary representation of an integer into a w-NAF redundant binary representation includes an acceptance device, a storage device, a shift register, and an update device. The acceptance device accepts the binary representation of the integer for every bit from lower bits. The storage device stores a state value expressed by 1 bit. The shift register stores a state value expressed by (w−1) bits. The update device determines a state of the storage device and a state of the (w−1)-bit shift register at next time, and determines a w-bit parallel output at current time by referring to a 1-bit value accepted by the acceptance device, the state value in the storage device, and the state value in the (w−1)-bit shift register.

10 Claims, 10 Drawing Sheets

(56) References Cited

OTHER PUBLICATIONS

Takagi, et al., *Radix-r Non-Adjacent Form and Its Application to Pairing-Based Cryptosystem*, IEICE Trans. Fundamentals, vol. E-89-A, No. 1, Jan. 2006, pp. 115-123.

Hankerso, et al., *Guide to Elliptic Curve Cryptography, Springer*, 2004, pp. 98-101.

Booth, Andrew D., "*A Signed Binary Multiplication Technique*"; Quart. Journ. Mech. Appl. Math., vol. IV, Pt. 2, 1951, pp. 236-240.

N. Takagi, "VLSI Algorithm for Arithmetic Operation", pp. 38-40, Corona, 2005 (with statement of relevance).

Handbook of Elliptic and Hyperelliptic Curve Cryptography, Chapter 9, Exponentiation, pp. 150-154, Section 9.1.4 Signed-digit recording, Jul. 19, 2005.

* cited by examiner

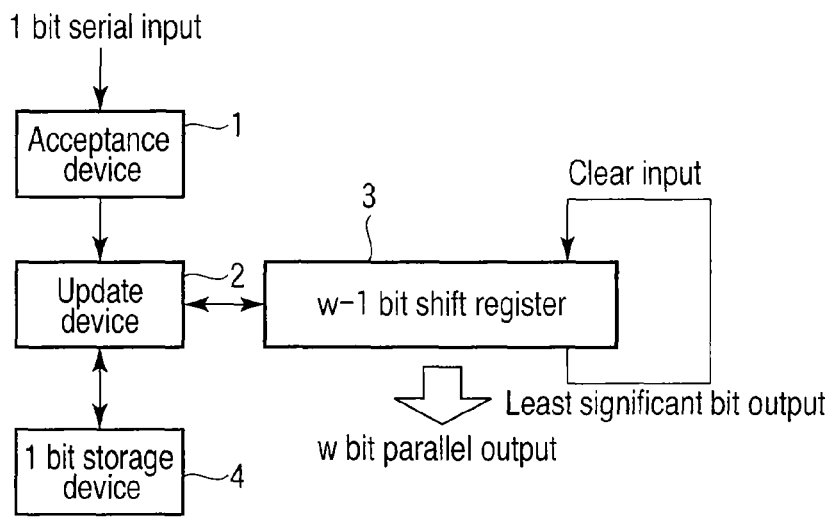
F I G. 1
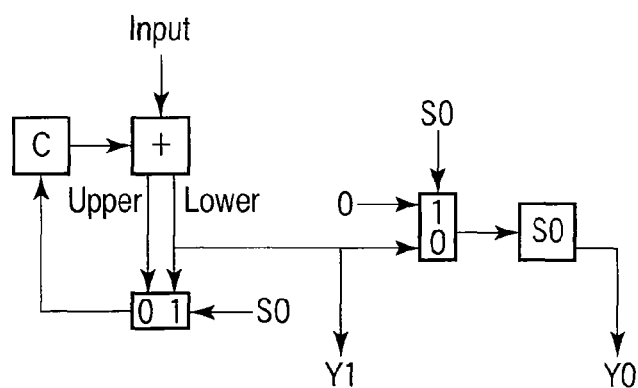
F I G. 2
F I G. 3
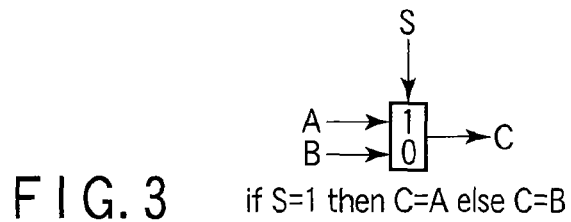
if S=1 then C=A else C=B

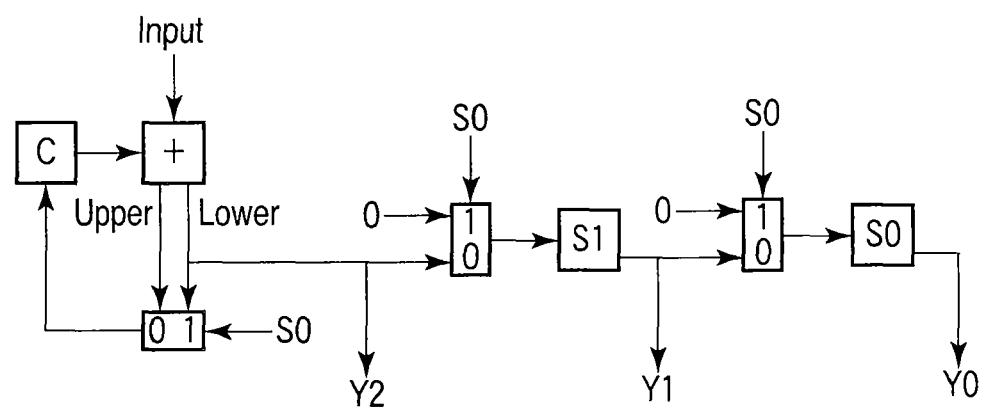
F I G. 5

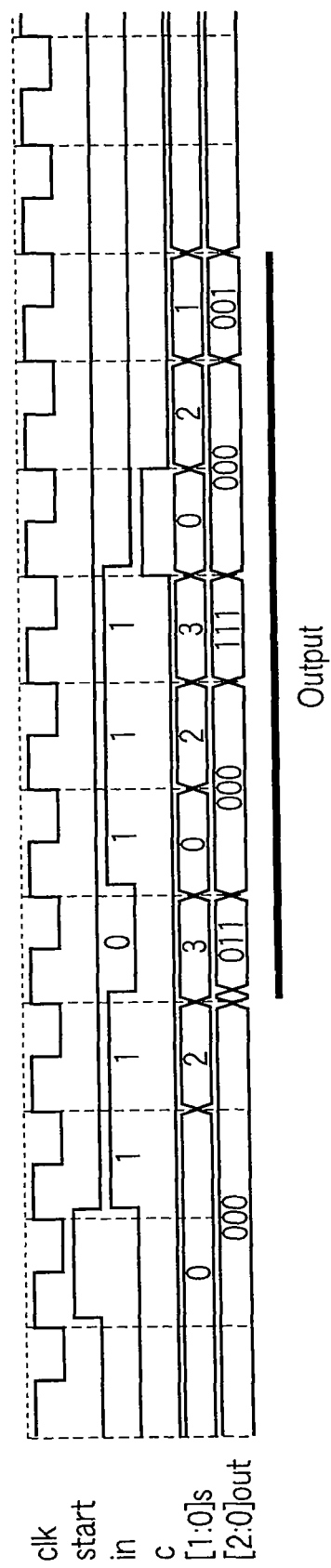
F I G. 6

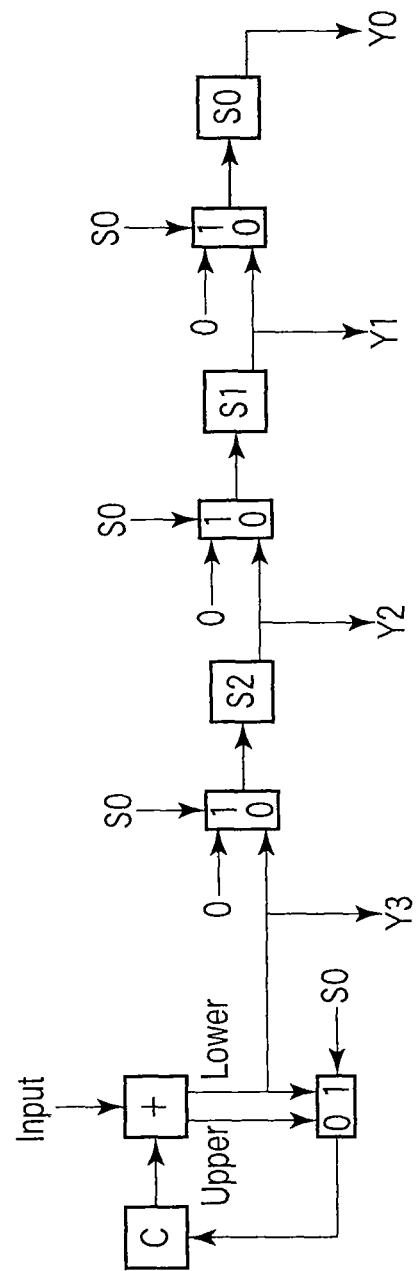
F I G. 7

| s | in | s' | out |
|---|----|----|-----|
| 0 | 0  | 0  | 0   |
| 0 | 1  | 1  | 0   |
| 1 | 0  | 0  | 1   |
| 1 | 1  | 2  | -1  |
| 2 | 0  | 1  | 0   |
| 2 | 1  | 2  | 0   | s:Current state  in:Input  s':Next state  out:Output

| s | in | s' | out |
|---|----|----|-----|
| 0 | 0  | 0  | 0   |
| 0 | 1  | 2  | 0   |
| 1 | 0  | 0  | 1   |
| 1 | 1  | 4  | -3  |
| 2 | 0  | 1  | 0   |
| 2 | 1  | 3  | 0   |
| 3 | 0  | 0  | 3   |
| 3 | 1  | 4  | -1  |
| 4 | 0  | 2  | 0   |
| 4 | 1  | 4  | 0   | s:Current state  in:Input  s':Next state  out:Output

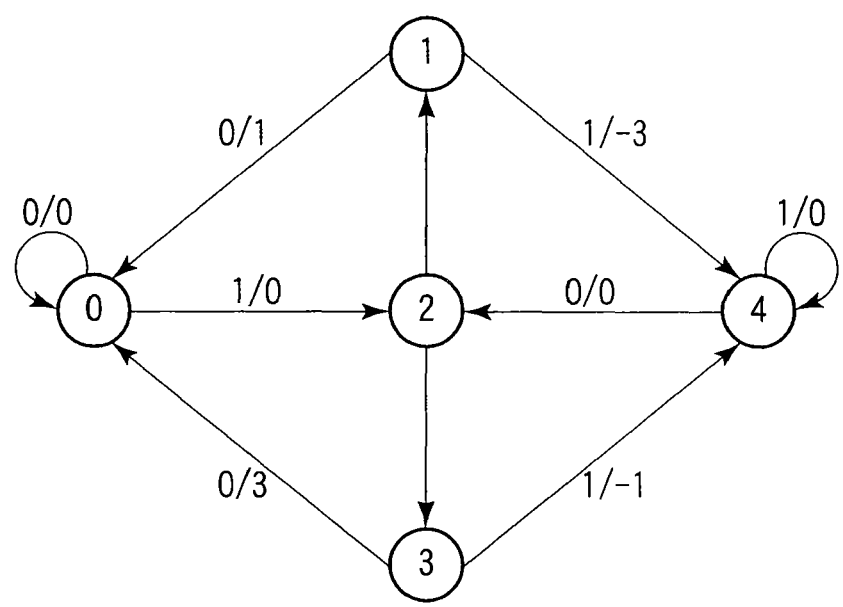
F I G. 12

FIG. 13

| s | in | s' | out |
|---|----|----|-----|
| 0 | 0  | 0  | 0   |
| 0 | 1  | 4  | 0   |
| 1 | 0  | 0  | 1   |
| 1 | 1  | 8  | -7  |
| 2 | 0  | 1  | 0   |
| 2 | 1  | 5  | 0   |
| 3 | 0  | 0  | 3   |
| 3 | 1  | 8  | -5  |
| 4 | 0  | 2  | 0   |
| 4 | 1  | 6  | 0   |
| 5 | 0  | 0  | 5   |
| 5 | 1  | 8  | -3  |
| 6 | 0  | 3  | 0   |
| 6 | 1  | 7  | 0   |
| 7 | 0  | 0  | 7   |
| 7 | 1  | 8  | -1  |
| 8 | 0  | 4  | 0   |
| 8 | 1  | 8  | 0   | s:Current state  in:Input  s':Next state  out:Output

| s | in | s' | out |
|---|---|---|---|
| 0 | 0 | 0 | 0 |
| 0 | 1 | 8 | 0 |
| 1 | 0 | 0 | 1 |
| 1 | 1 | 16 | -15 |
| 2 | 0 | 1 | 0 |
| 2 | 1 | 9 | 0 |
| 3 | 0 | 0 | 3 |
| 3 | 1 | 16 | -13 |
| 4 | 0 | 2 | 0 |
| 4 | 1 | 10 | 0 |
| 5 | 0 | 0 | 5 |
| 5 | 1 | 16 | -11 |
| 6 | 0 | 3 | 0 |
| 6 | 1 | 11 | 0 |
| 7 | 0 | 0 | 7 |
| 7 | 1 | 16 | -9 |
| 8 | 0 | 4 | 0 |
| 8 | 1 | 12 | 0 |

| s | in | s' | out |
|---|---|---|---|
| 9 | 0 | 0 | 9 |
| 9 | 1 | 16 | -7 |
| 10 | 0 | 5 | 0 |
| 10 | 1 | 13 | 0 |
| 11 | 0 | 0 | 11 |
| 11 | 1 | 16 | -5 |
| 12 | 0 | 6 | 0 |
| 12 | 1 | 14 | 0 |
| 13 | 0 | 0 | 13 |
| 13 | 1 | 16 | -3 |
| 14 | 0 | 7 | 0 |
| 14 | 1 | 15 | 0 |
| 15 | 0 | 0 | 15 |
| 15 | 1 | 16 | -1 |
| 16 | 0 | 8 | 0 |
| 16 | 1 | 16 | 0 | s:Current state  in:Input  s':Next state  out:Output

F I G. 14

NAF CONVERSION APPARATUS

CROSS REFERENCE TO RELATED APPLICATIONS

This application is a Continuation Application of PCT Application No. PCT/JP2010/050420, filed Jan. 15, 2010 and based upon and claiming the benefit of priority from prior Japanese Patent Application No. 2009-006797, filed Jan. 15, 2009, the entire contents of all of which are incorporated herein by reference.

FIELD

Embodiments described herein relate generally to a NAF conversion apparatus which converts the binary representation of an integer into a redundant binary representation.

BACKGROUND

The efficiency of multiplication can be increased by converting a multiplier into a redundant binary representation, as already known in, for example, the Booth method of the 1950s. Recently, a kind of redundant binary representation, NAF, is often used to speed up cryptographic processing.

NAF is one type of redundant binary representation, and an integer k has only one corresponding NAF representation NAF(k). It has been proved that the number of non-zero digits of NAF(k) is minimum among arbitrary redundant binary representations. The average number of non-zero digits is $1/3$.

In a general binary representation, either of the two numerals 0 and 1 appears in each digit position. In contrast, in NAF, one of the numerals −1, 0, and 1 appears.

The NAF representation has a feature in which at least either of two subsequent digits is 0, which is a reason for low density. Also, the name "non-adjacent form" is derived from this.

For example, a binary number 11011 (59=32+16+8+2+1 in decimal notation) is converted into a NAF representation 1000-10-1 (64−4−1=59).

Table 1 shows an example of NAF conversion of binary numbers of 4 bits or less.

TABLE 1

| | |
|---|---|
| 0 | 0 |
| 1 | 1 |
| 10 | 10 |
| 11 | 10-1 |
| 100 | 100 |
| 101 | 101 |
| 110 | 10-10 |
| 111 | 100-1 |
| 1000 | 1000 |
| 1001 | 1001 |
| 1010 | 1010 |
| 1011 | 10-10-1 |
| 1100 | 10-100 |
| 1101 | 10-101 |
| 1110 | 100-10 |
| 1111 | 1000-1 |

There are known several algorithms for converting an integer k into a NAF representation NAF(k). A NAF expansion is w-NAF.

The difference between w-NAF and general NAF is that w-NAF can use a wider variety of numerals for each digit. For 3-NAF, five numerals −3, −1, 0, 1, and 3 are usable. The aforementioned NAF can be regarded as 2-NAF.

Tables 2 and 3 show features of w-NAF.

Table 2 is a list of numerals used in respective NAFs.

TABLE 2

| | Numbers Used | |
|---|---|---|
| 2-NAF | −1, 0, 1 | Three types |
| 3-NAF | −3, −1, 0, 1, 3 | Five types |
| 4-NAF | −7, −5, −3, −1, 0, 1, 3, 5, 7 | Nine types |
| ... | | |
| w-NAF | $-2^{(w-1)}-1, -2^{(w-1)}-3, \ldots, -1,$ $0, 1, \ldots, 2^{(w-1)}-3, 2^{(w-1)}-1$ | $2^{(w-1)}+1$ types |

Note that "^" indicates the raising to a power. For example, $2\hat{\,}w$ means 2 to the $w^{th}$ power.

Table 3 is a list of non-zero digit densities in respective NAFs.

TABLE 3

| | Density |
|---|---|
| 2-NAF | 1/3 |
| 3-NAF | 1/4 |
| 4-NAF | 1/5 |
| ... | |
| w-NAF | $1/(w+1)$ | w-NAF has a feature in which the number of non-zero digits among w subsequent digits is one at most. Lower density leads to a smaller number of digits to be processed. The number of clocks decreases, but many preparations are necessary, so there is a trade-off between them.

BRIEF DESCRIPTION OF THE DRAWINGS

FIG. 1 is a block diagram showing the functional arrangement of a w-NAF conversion apparatus.

FIG. 2 is a diagram showing a 2-NAF conversion apparatus.

FIG. 3 is a diagram for explaining a selector description method.

FIG. 5 is a diagram showing a 3-NAF conversion apparatus.

FIG. 6 is a timing chart showing a conversion example of the 3-NAF conversion apparatus.

FIG. 7 is a diagram showing a 4-NAF conversion apparatus.

FIG. 12 is a diagram showing a 3-NAF state transition diagram.

FIG. 13 is a table showing a 4-NAF state transition table.

FIG. 14 is a table showing a 5-NAF state transition table.

DETAILED DESCRIPTION

Figure 4:
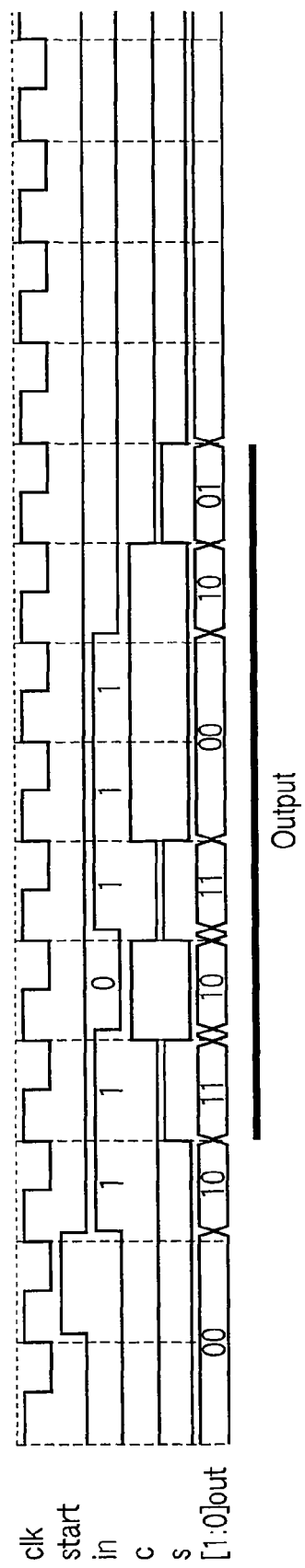
FIG. 4 is a timing chart showing a conversion example of the 2-NAF conversion apparatus.

In general, according to one embodiment, a NAF conversion apparatus which converts a binary representation of an integer into a w-NAF redundant binary representation includes an acceptance device, a storage device, a shift register, and an update device. The acceptance device accepts the binary representation of the integer for every bit from lower bits. The storage device stores a state value expressed by 1 bit. The shift register stores a state value expressed by (w−1) bits. The update device determines a state of the storage device and a state of the (w−1)-bit shift register at next time, and determines a w-bit parallel output at current time by referring to a 1-bit value accepted by the acceptance device, the state value in the storage device, and the state value in the (w−1)-bit shift register.

FIG. 1 is a block diagram showing the functional arrangement of a NAF conversion apparatus according to an embodiment. The apparatus comprises an acceptance device 1 for accepting a 1-bit serial input, an update device 2 connected to the acceptance device 1, a (w−1)-bit shift register 3 for parallelly outputting a w-bit value in a w-NAF representation, and a 1-bit storage device 4 connected to the update device 2. When the NAF conversion apparatus is formed from hardware, the acceptance device 1 need not be arranged independently and is implemented by a connecting portion where the signal line and update device are connected.

The initial values of the 1-bit storage device 4 and (w−1)-bit shift register 3 are 0.

In the NAF conversion apparatus according to the embodiment, the acceptance device 1 accepts the binary representation of an integer to be converted into a w-NAF representation sequentially from lower bits one by one in synchronization with clocks. The accepted value is called a 1-bit serial input. The contents of the 1-bit storage device 4 and (w−1)-bit shift register 3 are replaced with new ones by the update device 2 for every clock, i.e., every 1-bit input.

The update device 2 calculates the new contents of the 1-bit storage device 4 and (w−1)-bit shift register 3 in accordance with the contents of the 1-bit storage device 4 and (w−1)-bit shift register 3 before updating and the 1-bit serial input. Also, the update device 2 determines a w-bit parallel output. That is, a w-bit conversion result is output for every clock. At this time, a valid output is output after w−1 clocks. Note that the least significant bit output value "1" is supplied to the (w−1)-bit shift register 3 as a clear input of a trigger to clear the (w−1)-bit shift register 3. When the least significant bit output value "1" is supplied to the (w−1)-bit shift register 3, the value of the (w−1)-bit shift register 3 is cleared.

A 2-NAF conversion apparatus as an implementation of the NAF conversion apparatus in FIG. 1 will be explained with reference to FIG. 2. As shown in FIG. 2, C in the 2-NAF conversion apparatus corresponds to the 1-bit storage device 4 in the arrangement of FIG. 1. Similarly, S0 corresponds to the 1-bit shift register 3 (since w=2, w−1=1 bit). Y1 and Y0 correspond to a 2-bit parallel output. + is a 1-bit adder and corresponds to an element of the update device 2 in FIG. 1.

Special signs will be explained with reference to FIG. 3. A selector is described as shown in FIG. 3. More specifically, the output is C=A for a selection signal S=1 and C=B for S=0.

The arrangement in FIG. 1 in which the least significant bit output is given as the clear input of the (w−1)-bit shift register corresponds to the arrangement in FIG. 2 in which Y0 as part of the parallel output is given as the selection signal S0 of the selector.

The initial values of C and S0 are 0. For S0=1, the next value of C is a lower bit of the input+C, the next value of S0 is 0, Y1 is a lower bit of the input+C, and Y0 is S0, i.e., 1. To the contrary, for S0=0, the next value of C is an upper bit of the input+C, the next value of S0 is a lower bit of the input+C, Y1 is a lower bit of the input+C, and Y0 is S0, i.e., 0. Note that the Y1 value is written in S0 at the timing of the next clock.

An actual conversion example of the 2-NAF conversion apparatus will be explained with reference to FIG. 4. FIG. 4 is a timing chart, and respective values are updated every time a clock is input. In FIG. 4, clk is a clock, start is a start signal, in is an input, c is the 1-bit storage device 4, s is the 1-bit shift register 3, and out is a 2-bit parallel output.

An example in which a binary number 111011 (59=32+16+8+2+1 in decimal notation) is input will be explained. As is apparent from the in line, 111011 is input sequentially from lower bits in synchronization with respective clocks. The output is delayed from the input by one clock.

The meaning of the output out is "0" for "00" or "10", "1" for "01", and "−1" for "11".

As described above, a plurality of outputs express 0, but these are all even numbers, and it suffices to regard the output as 0 when the least significant bit is 0. Note that an output other than 0 is a two's complement representation of 2 bits. Generally, w-NAF is 0 when the least significant bit of the output is 0, and a two's complement representation of w bits when it is 1. Pure 0 can also be output by ANDing the least significant bit and another bit of the output. Even the result is output from lower bits. As can be seen from FIG. 4, −10-10001 is output sequentially from lower bits. Rewriting it from upper bits yields 1000−10−1, which is 64−4−1=59. The NAF represents the same number as that of the original binary number. The number of non-zero (1) bits is five in the original binary number, and after NAF conversion, decreases to three. In NAF conversion, the number of output bits sometimes becomes a maximum of the original number of bits+1, as in this example.

FIG. 5 shows a 3-NAF conversion apparatus as another implementation of the NAF conversion apparatus in FIG. 1. As shown in FIG. 5, C in the 3-NAF conversion apparatus corresponds to the 1-bit storage device 4 in the arrangement of FIG. 1. Similarly, S1 and S0 correspond to the 2-bit shift register 3 (since w=3, w−1=2 bits). Y2, Y1, and Y0 correspond to a 3-bit parallel output. + is a 1-bit adder and corresponds to an element of the update device 2 in FIG. 1. The arrangement in FIG. 1 in which the least significant bit output is given as the clear input of the (w−1)-bit shift register corresponds to the arrangement in FIG. 5 in which Y0 as part of the parallel output is given as the selection signals S0 of the two selectors.

The 3-NAF conversion apparatus in FIG. 5 is different from the 2-NAF conversion apparatus in FIG. 2 in that Y2 and S1 are added. The operation is the same as that of the 2-NAF conversion apparatus.

The initial values of C and S0 are 0. For S0=1, the next value of C is a lower bit of the input+C, the next values of S1 and S0 are 0, Y2 is a lower bit of the input+C, Y1 is S1, and Y0 is S0, i.e., 1. In contrast, for S1=0, the next value of C is an upper bit of the input+C, the next value of S1 is a lower bit of the input+C, the next value of S0 is S1, Y2 is a lower bit of the input+C, Y1 is S1, and Y0 is S0, i.e., 0.

An actual conversion example of the 3-NAF conversion apparatus will be explained with reference to FIG. 6. FIG. 6 is a timing chart, and respective values are updated every time a clock is input. In FIG. 6, clk is a clock, start is a start signal, in is an input, c is the 1-bit storage device 4, s is the 2-bit shift register 3, and out is a 3-bit parallel output.

An example in which a binary number 111011 (59=32+16+8+2+1 in decimal notation) is input will be explained. The in line reveals that 111011 is input sequentially from lower bits in synchronization with respective clocks. The output is delayed from the input by two clocks. The meaning of the output out is "0" for "000", "010", "100", and "110", "1" for "001", "3" for "011", "−3" for "101", and "−1" for "111".

As described above, a plurality of outputs express 0, but these are all even numbers, and it suffices to regard the output as 0 when the least significant bit is 0. Note that an output other than 0 is a two's complement representation of 3 bits. Even the result is output from lower bits. As is apparent from FIG. 6, 300-1001 is output sequentially from lower bits. Rewriting it from upper bits yields 100-1003, which is 64−8+3=59. The NAF represents the same number as that of the original binary number. In NAF conversion, the number of output bits sometimes becomes a maximum of the original number of bits+1, as in this example.

FIG. 7 shows a 4-NAF conversion apparatus as still another implementation of the NAF conversion apparatus in FIG. 1. As shown in FIG. 7, C in the 4-NAF conversion apparatus corresponds to the 1-bit storage device 4 in the arrangement of FIG. 1. Similarly, S2, S1, and S0 correspond to the 3-bit shift register 3 (since w=4, w−1=3 bits). Y3, Y2, Y1, and Y0 correspond to a 4-bit parallel output. + is a 1-bit adder and is an element of the update device 2 in FIG. 1.

The 4-NAF conversion apparatus in FIG. 7 has the same structure as those of the 2-NAF conversion apparatus in FIG. 2 and the 3-NAF conversion apparatus in FIG. 5 except that the length of the shift register 3 and the number of outputs increase.

Figure 8:
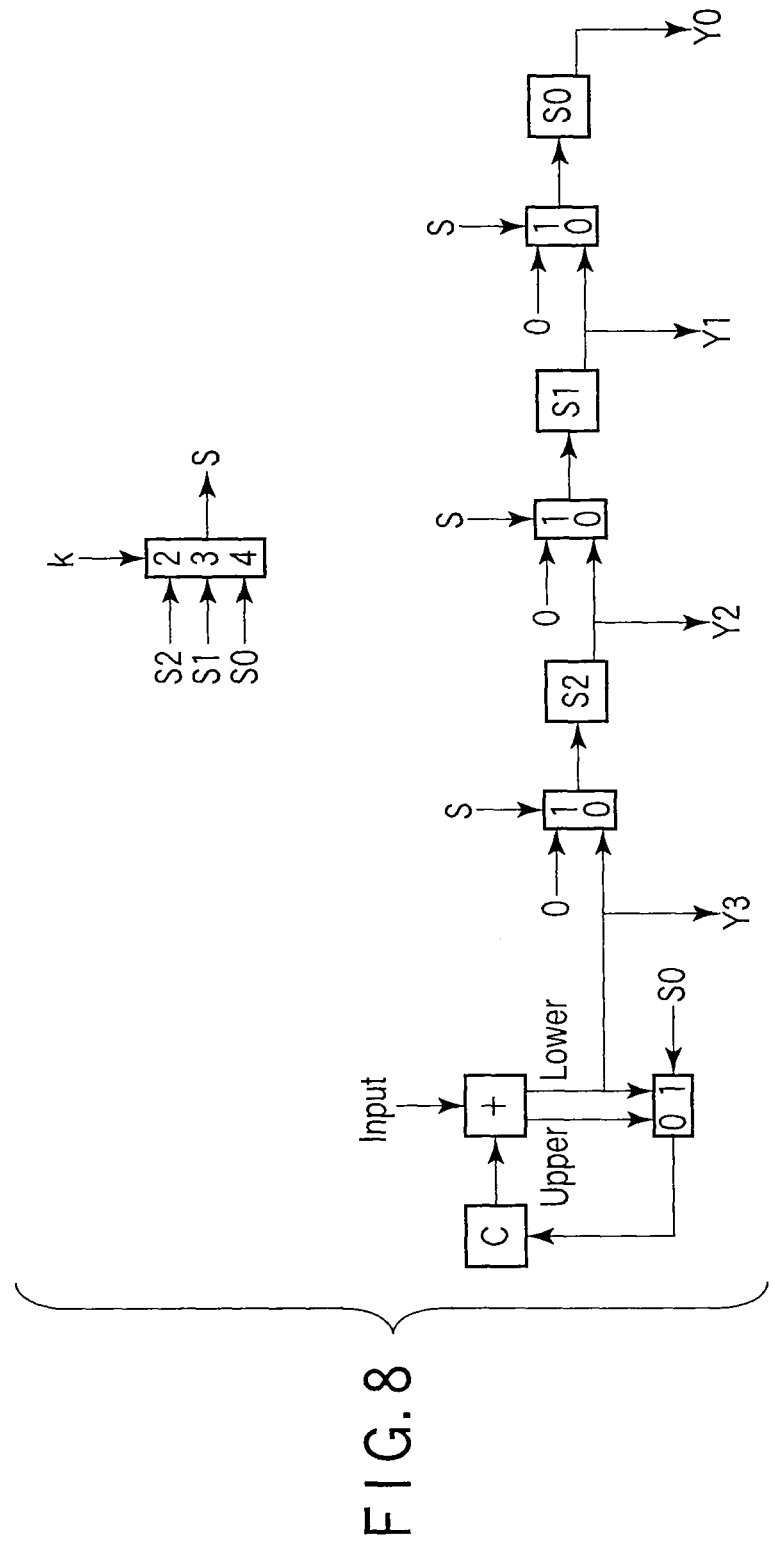
FIG. 8 is a diagram showing a 2 to 4-NAF conversion apparatus.

An example of a k-NAF conversion apparatus with a variable k will be explained with reference to FIG. 8. In this example, 2, 3, or 4 can be selected as the k value. In FIG. 8, C in the k-NAF conversion apparatus corresponds to the 1-bit storage device 4 in the arrangement of FIG. 1. S2, S1, and S0 correspond to the 3-bit shift register 3 (since w=4, w−1=3 bits) in the arrangement of FIG. 1. Y3, Y2, Y1, and Y0 correspond to a 4-bit parallel output. + is a 1-bit adder.

S is the least significant bit which changes depending on k. It suffices to employ S2 as the least significant bit S for k=2, that is, to operate this apparatus as a 2-NAF conversion apparatus, S1 as the least significant bit S to operate it as a 3-NAF conversion apparatus, and S0 as the least significant bit S to operate it as a 4-NAF conversion apparatus. At this time, Y3 and Y2 are output for 2-NAF, Y3, Y2, and Y1 are output for 3-NAF, and Y3, Y2, Y1, and Y0 are output for 4-NAF.

In a situation in which the memory is limited, such as in a cell phone, a smaller w can save the memory though calculation itself slows down. In general, a larger w can speed up calculation but increases memory consumption. Calculation can therefore be speeded up by, for example, decreasing w when the free space of the memory is insufficient, and increasing it when the free space of the memory is sufficient. Also, power can be saved by decreasing w and stopping power supply to an unnecessary register.

Figures 9, 10, 11:
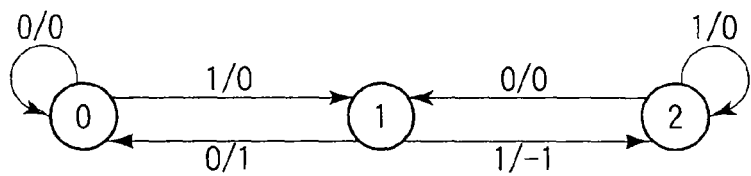
FIG. 9 is a table showing a 2-NAF state transition table.
FIG. 10 is a diagram showing a 2-NAF state transition diagram.
FIG. 11 is a table showing a 3-NAF state transition table.

The 2-NAF conversion apparatus will be explained from another viewpoint with reference to FIG. 9. More specifically, the 2-NAF conversion apparatus according to the embodiment will be explained in the form of a state transition table as shown in FIG. 9. In FIG. 9, s is the current state (three states are possible), in is a 1-bit input, s' is the next state, and out is an output. In an initial state, s=0. Every time the input in is received by 1 bit, the state changes to s' determined by s and in, outputting the output out.

In the first state, for the input=0, the state changes to the first state to output 0, and for the input=1, the second state to output 0. In the second state, for the input=0, the state changes to the first state to output 1, and for the input=1, the third state to output −1. In the third state, for the input=0, the state changes to the second state to output 0, and for the input=1, the third state to output 0. In this manner, when the binary representation of an integer is input for every bit from lower bits, a 2-NAF redundant binary representation is output for every two bits.

The 2-NAF conversion apparatus will be further explained with reference to FIG. 10. In FIG. 10, each circled numeral indicates the state, which corresponds to s in the state transition table. There are three states. In numeral/numeral, the left numeral indicates in and the right numeral indicates out. This means that the right numeral is output upon receiving the left numeral. FIG. 10 shows a state transition diagram rewritten from the state transition table in FIG. 9. The initial state is state 0.

The 3-NAF conversion apparatus will be explained from another viewpoint with reference to FIG. 11. More specifically, the 3-NAF conversion apparatus according to the embodiment will be explained in the form of a state transition table as shown in FIG. 11. The number of possible values as the state s increases to five states of 0 to 4. The output takes five values of −3, −1, 0, 1, and 3 because of 3-NAF.

In the first state, for the input=0, the state changes to the first state to output 0, and for the input=1, the third state to output 0. In the second state, for the input=0, the state changes to the first state to output 1, and for the input=1, the fifth state to output −3. In the third state, for the input=0, the state changes to the second state to output 0, and for the input=1, the fourth state to output 0. In the fourth state, for the input=0, the state changes to the first state to output 3, and for the input=1, the fifth state to output −1. In the fifth state, for the input=0, the state changes to the third state to output 0, and for the input=1, the fifth state to output 0. In this way, when the binary representation of an integer is input for every bit from lower bits, a 3-NAF redundant binary representation is output for every three bits.

FIG. 12 shows a state transition diagram rewritten from the state transition table in FIG. 11, similar to FIG. 10.

The 4-NAF conversion apparatus will be explained from another viewpoint with reference to FIG. 13. More specifically, the 4-NAF conversion apparatus according to the embodiment will be explained in the form of a state transition table as shown in FIG. 13. The number of possible values as the state s increases to nine states of 0 to 8. The output takes nine values of −7, −5, −3, −1, 0, 1, 3, 5, and 7 because of 4-NAF.

In the first state, for the input=0, the state changes to the first state to output 0, and for the input=1, the fifth state to output 0. In the second state, for the input=0, the state changes to the first state to output 1, and for the input=1, the ninth state to output −7. In the third state, for the input=0, the state changes to the second state to output 0, and for the input=1, the sixth state to output 0. In the fourth state, for the input=0, the state changes to the first state to output 3, and for the input=1, the ninth state to output −5. In the fifth state, for the input=0, the state changes to the third state to output 0, and for the input=1, the seventh state to output 0. In the sixth state, for the input=0, the state changes to the first state to output 5, and for the input=1, the ninth state to output −3. In the seventh state, for the input=0, the state changes to the fourth state to output 0, and for the input=1, the eighth state to output 0. In the eighth state, for the input=0, the state changes to the first state to output 7, and for the input=1, the ninth state to output −1. In the ninth state, for the input=0, the state changes to the fifth state to output 0, and for the input=1, the ninth state to output 0. As described above, when the binary representation of an integer is input for every bit from lower bits, a 4-NAF redundant binary representation is output for every four bits.

FIG. 14 shows a 5-NAF conversion apparatus. A description of the state transition table is the same as that for FIG. 9. The number of possible values as the state s increases to 17 states of 0 to 16. w-NAF generally takes $2^{(w-1)}+1$ states.

The above-described embodiment can be implemented by a sequential circuit, but can also be implemented as a synchronous circuit or asynchronous circuit.

New cipher attacks such as side-channel attack have appeared. The above-described embodiment can prevent the side-channel attack by changing w during scalar multiplication in elliptic curve cryptography. w can be changed when the shift register outputs 0, i.e., immediately after it outputs a value other than 0.

It will be appreciated that the above described embodiments can provide a scalable w-NAF conversion apparatus with small circuit scale. In particular, the w-NAF conversion apparatus hardly changes for an arbitrary w (only the length of the shift register changes), so even w can be changed dynamically. The circuit scale is smaller than that for a known 2-NAF conversion algorithm and also for a well-known w-NAF conversion algorithm.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A NAF conversion apparatus which converts a binary representation of an integer into a w-NAF redundant binary representation, comprising:
   an acceptance device configured to accept the binary representation of the integer for every bit from lower bits;
   a storage device configured to store a state value expressed by 1 bit;
   a shift register configured to store a state value expressed by (w−1) bits; and
   an update device configured to determine a state of the storage device and a state of the (w−1)-bit shift register at next time, and determine a w-bit parallel output at current time by referring to a 1-bit value accepted by the acceptance device, the state value in the storage device, and the state value in the (w−1)-bit shift register.

2. The NAF conversion apparatus according to claim 1, wherein the update device updates the state of the storage device at the next time to, when a least significant bit of the (w−1)-bit shift register at the current time is 1, one lower bit of a sum of 1 bit input from the acceptance device and a state of the storage device at the current time, and to, when a most significant bit of the (w−1)-bit shift register at the current time is 0, one upper bit of the sum,
   updates the state of the (w−1)-bit shift register at the next time to, when the least significant bit of the (w−1)-bit shift register at the current time is 1, 0 of (w−1) bits, and to, when the least significant bit of the (w−1)-bit shift register at the current time is 0, to a value of (w−1) bits in which a lower bit of the sum is set as a most significant bit by shifting the shift register at the current time toward a lower position by one bit, and
   updates the parallel output at the current time to a value of the shift register in which the lower bit of the sum is set as a most significant bit and lower (w−1) bits are the (w−1) bits.

3. The NAF conversion apparatus according to claim 1, wherein upper k bits of the parallel output are output using lower (w−k) bits instead of the least significant bit of the (w−1) shift register.

4. The NAF conversion apparatus according to claim 3, wherein the k is set to a small value corresponding to available resources comprising CPU power and a memory capacity.

5. The NAF conversion apparatus according to claim 3, wherein a k value is changed in a range of 2 to w during NAF conversion.

6. The NAF conversion apparatus according to claim 1, wherein the 1-bit storage device, the (w−1)-bit shift register, and the update device form a synchronous circuit.

7. The NAF conversion apparatus according to claim 1, wherein the 1-bit storage device, the (w−1)-bit shift register, and the update device form an asynchronous circuit.

8. A 2-NAF conversion apparatus comprising:
   a storage device configured to store three states; and
   an update device configured to:
   in a first state,
      when an input is 0 from a 1-bit serial input, remain in the first state to output 0 from a 2-bit parallel output, and
      when the input is 1 from the 1-bit serial input, change to a second state to output 0 from the 2-bit parallel output,
   in the second state,
      when the input is 0 from the 1-bit serial input, change to the first state to output 1 from the 2-bit parallel output, and
      when the input is 1 from the 1-bit serial input, change to a third state to output −1 from the 2-bit parallel output, and
   in the third state,
      when the input is 0 from the 1-bit serial input, change to the second state to output 0 from the 2-bit parallel output, and
      when the input is 1 from the 1-bit serial input, change to the third state to output 0 from the 2-bit parallel output,
   wherein when a binary representation of an integer is input from the 1-bit serial input for every bit from lower bits, a 2-NAF redundant binary representation is output from the 2-bit parallel output for every two bits.

9. A 3-NAF conversion apparatus comprising:
   a storage device configured to store five states; and
   an update device configured to:
   in a first state,
      when an input is 0 from a 1-bit serial input, remain in the first state to output 0 to a 3-bit parallel output, and
      when the input is 1 from the 1-bit serial input, change to a third state to output 0 to the 3-bit parallel output,
   in a second state,
      when the input is 0 from the 1-bit serial input, change to the first state to output 1 to the 3-bit parallel output, and
      when the input is 1 from the 1-bit serial input, change to a fifth state to output −3 to the 3-bit parallel output,
   in the third state,
      when the input is 0 from the 1-bit serial input, change to the second state to output 0 to the 3-bit parallel output, and
      when the input is 1 from the 1-bit serial input, change to a fourth state to output 0 to the 3-bit parallel output,
   in the fourth state,
      when the input is 0 from the 1-bit serial input, change to the first state to output 3 to the 3-bit parallel output, and
      when the input is 1 from the 1-bit serial input, change to the fifth state to output −1 to the 3-bit parallel output, and
   in the fifth state, when the input is 0 from the 1-bit serial input, change to the third state to output 0 to the 3-bit parallel output, and when the input is 1 from the 1-bit serial input, remain in the fifth state to output 0 to the 3-bit parallel output, wherein when a binary representation of an integer is input from the 1-bit serial input for every bit from lower bits, a 3-NAF redundant binary representation is output from the 3-bit parallel output for every three bits.

10. A 4-NAF conversion apparatus comprising:

a storage device configured to store nine states; and an update device configured to:

in a first state, when an input is 0 from a 1-bit serial input, remain in the first state to output 0 to a 4-bit parallel output, and when the input is 1 from the 1-bit serial input, change to a fifth state to output 0 to the 4-bit parallel output, in a second state, when the input is 0 from the 1-bit serial input, change to the first state to output 1 to the 4-bit parallel output, and when the input is 1 from the 1-bit serial input, change to a ninth state to output −7 to the 4-bit parallel output, in a third state, when the input is 0 from the 1-bit serial input, change to the second state to output 0 to the 4-bit parallel output, and when the input is 1 from the 1-bit serial input, change to a sixth state to output 0 to the 4-bit parallel output, in a fourth state, when the input is 0 from the 1-bit serial input, change to the first state to output 3 to the 4-bit parallel output, and when the input is 1 from the 1-bit serial input, change to the ninth state to output −5 to the 4-bit parallel output, in the fifth state, when the input is 0 from the 1-bit serial input, change to the third state to output 0 to the 4-bit parallel output, and when the input is 1 from the 1-bit serial input, change to a seventh state to output 0 to the 4-bit parallel output, in the sixth state, when the input is 0 from the 1-bit serial input, change to the first state to output 5 to the 4-bit parallel output, and when the input is 1 from the 1-bit serial input, change to the ninth state to output −3 to the 4-bit parallel output, in the seventh state, when the input is 0 from the 1-bit serial input, change to the fourth state to output 0 to the 4-bit parallel output, and when the input is 1 from the 1-bit serial input, change to an eighth state to output 0 to the 4-bit parallel output, in the eighth state, when the input is 0 from the 1-bit serial input, change to the first state to output 7 to the 4-bit parallel output, and when the input is 1 from the 1-bit serial input, change to the ninth state to output −1 to the 4-bit parallel output, and in the ninth state, when the input is 0 from the 1-bit serial input, change to the fifth state to output 0 to the 4-bit parallel output, and when the input is 1 from the 1-bit serial input, remain in the ninth state to output 0 to the 4-bit parallel output, wherein when a binary representation of an integer is input from the 1-bit serial input for every bit from lower bits, a 4-NAF redundant binary representation is output from the 4-bit parallel output for every four bits.

* * * * *